US006325524B1

United States Patent
Weber et al.

(10) Patent No.: US 6,325,524 B1
(45) Date of Patent: Dec. 4, 2001

(54) SOLID STATE BASED ILLUMINATION SOURCE FOR A PROJECTION DISPLAY

(75) Inventors: Andreas G. Weber, Redwood City; Gergory M. Cutler, Cupertino; William R. Trutna, Jr., Atherton, all of CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/239,571

(22) Filed: Jan. 29, 1999

(51) Int. Cl.[7] .................................................. F21V 13/04
(52) U.S. Cl. .......................... 362/245; 362/247; 362/800
(58) Field of Search ................................. 362/245, 247, 362/241, 545, 800

(56) References Cited

U.S. PATENT DOCUMENTS

| 3,877,801 | | 4/1975 | McGovern | 353/38 |
| 4,271,408 | | 6/1981 | Teshima et al. | 340/702 |
| 4,733,335 | * | 3/1988 | Serizawa et al. | 362/800 |
| 5,101,326 | * | 3/1992 | Roney | 362/800 |
| 5,365,411 | | 11/1994 | Rycroft et al. | 362/20 |
| 5,394,315 | * | 2/1995 | Ahroni | 362/241 |
| 5,618,096 | * | 4/1997 | Parker et al. | 362/800 |
| 5,782,553 | * | 7/1998 | McDermott | 362/245 |
| 5,819,454 | * | 10/1998 | Rosenitsch | 362/241 |
| 6,036,327 | * | 3/2000 | Blonder et al. | 362/800 |
| 6,170,963 | * | 1/2001 | Arnold | 362/800 |
| 6,173,517 | * | 1/2001 | Eibner et al. | 362/800 |

FOREIGN PATENT DOCUMENTS

0241155  *  11/1986  (DE) ..................................... 362/800

* cited by examiner

*Primary Examiner*—Sandra O'Shea
*Assistant Examiner*—Peggy A Neils

(57) ABSTRACT

A light source for generating light that is collected by an optical system that collects light leaving the light source within a predetermined acceptance angle relative to an axis defined in relation to the optical system. The light source includes a plurality of LEDs mounted on a reflecting base. Each of the LEDs generates light that leaves that LED via a top surface, a bottom surface, and one or more side surfaces of the LED. The reflecting base has a reflective surface in contact with the bottom surface of each of the LEDs. Light leaving the side surfaces of the LEDs is reflected into the acceptance angle of the optical system by a plurality of reflectors. In one embodiment of the invention, the reflectors include a plurality of reflecting facets for reflecting light leaving the side surfaces of the LEDs. The facets may be part of the reflective base or separate objects located between the LEDs. In another embodiment of the invention, the reflectors include scattering centers located between the LEDs.

4 Claims, 1 Drawing Sheet

FIGURE 1
(PRIOR ART)
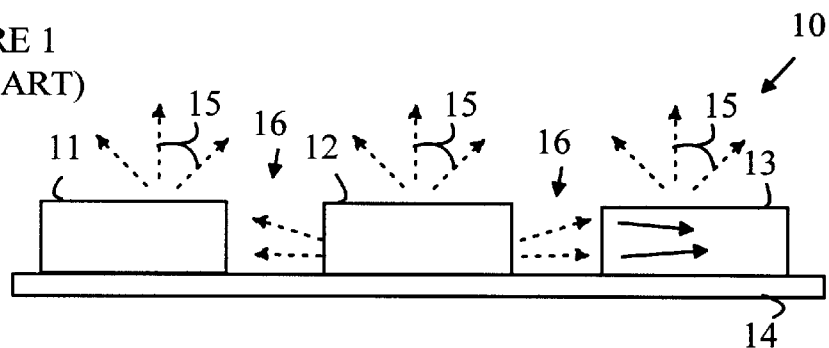
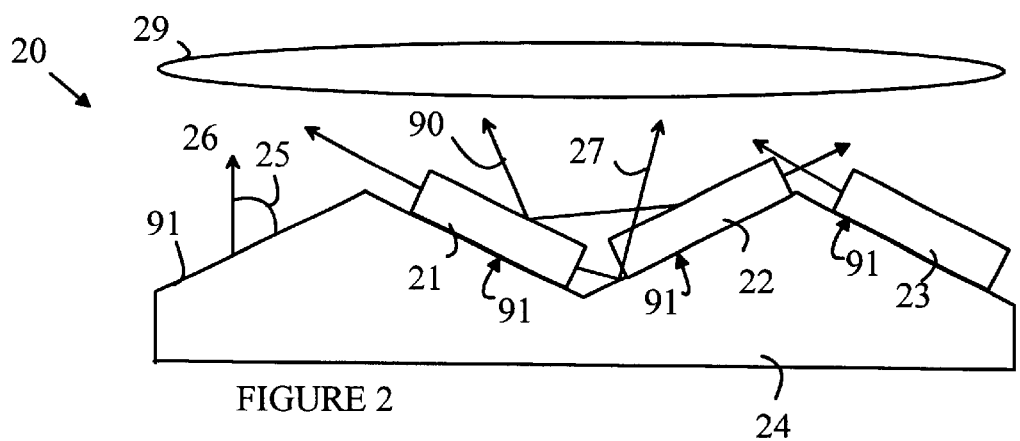
FIGURE 2
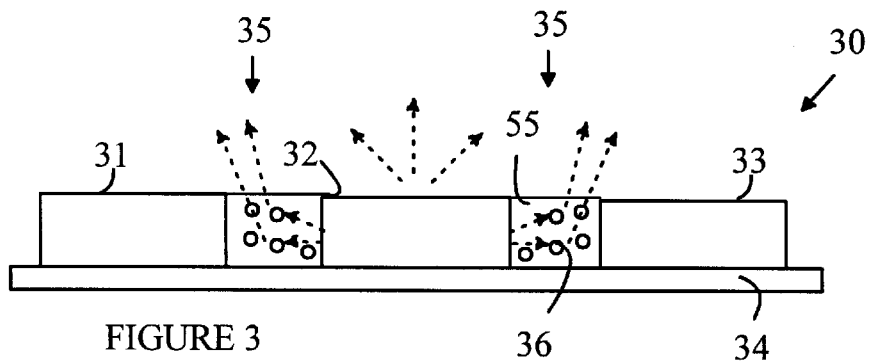
FIGURE 3
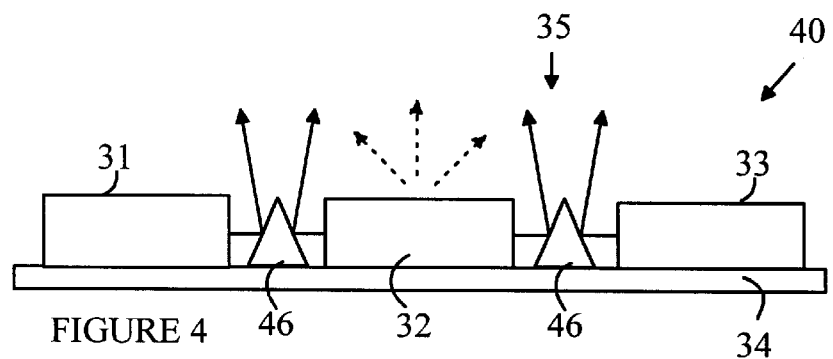
FIGURE 4

SOLID STATE BASED ILLUMINATION SOURCE FOR A PROJECTION DISPLAY

FIELD OF THE INVENTION

The present invention relates to light sources, and more particularly, to a solid state light source for use in projectors and the like.

BACKGROUND OF THE INVENTION

Systems for projecting images onto screens are known in the art. Systems based on incandescent or arc lamps are often used in projection displays. However, such sources have limited lifetimes and poor output stability over the life of the light source. In addition, spectral components, such as UV and IR, that are not needed for display purposes must be filtered out of the emissions to avoid damage to other components or the viewer's eyes.

Sources based on combinations of Light Emitting Diodes (LEDs) or semiconductor lasers that emit red, green and blue light can be used as a solid state light source. Since LED and laser emissions are typically spectrally narrow band light sources, the use of color filters for the display can be omitted. Also the optical output of semiconductor lasers and LEDs can typically be electrically modulated at a rate that is sufficient for a time sequential color display. Furthermore most solid state lasers emit linear polarized light which further improves the efficiency of light production and simplifies the optics in projection systems.

Unfortunately, individual solid state light sources do not provide sufficient brightness for many projection display applications; hence, arrays of LEDs must be utilized to obtain sufficient output. A significant fraction of the light generated in an LED array is lost. Conventional LEDs emit light through the top, the bottom and the side facets. Most high power red, green and blue LEDs contain an optically transparent substrate. If the LEDs are placed on a planar heat sink, the substrate and top surface of the LED act as an optical waveguide, guiding the light between neighboring LEDs. This waveguide effect transports a significant fraction of the light emitted through the side facets of the LEDs to the outer edge of the array. The light is attenuated during this transportation process and emitted at a place where it is only partially captured by the collimating optics.

Broadly, it is the object of the present invention to provide an improved solid state light source.

It is further object of the present invention to provide an improved solid state light source that more efficiently captures the light leaving the side facets of the LEDs than prior art light sources.

These and other objects of the present invention will become apparent to those skilled in the art from the following detailed description of the invention and the accompanying drawings.

SUMMARY OF THE INVENTION

The present invention is a light source for generating light that is collected by an optical system that collects light leaving the light source within a predetermined acceptance angle relative to an axis defined in relation to the optical system. The light source includes a plurality of LEDs mounted on a reflecting base. Each of the LEDs generates light that leaves that LED via a top surface, a bottom surface, and one or more side surfaces of the LED. The reflecting base has a reflective surface in contact with the bottom surface of each of the LEDs. Light leaving the side surfaces of the LEDs is reflected into the acceptance angle of the optical system by a plurality of reflectors. In one embodiment of the invention, the reflectors include a plurality of reflecting facets for reflecting light leaving the side surfaces of the LEDs. The facets may be part of the reflective base or separate objects located between the LEDs. In another embodiment of the invention, the reflectors include scattering centers located between the LEDs.

BRIEF DESCRIPTION OF THE DRAWINGS

FIG. 1 is a cross-sectional view of a prior art LED-based light source.

FIG. 2 is a cross-sectional view of one embodiment of a light source according to the present invention.

FIG. 3 is a cross-sectional view of another embodiment of a light source according to the present invention.

FIG. 4 is a cross-sectional view of yet another embodiment of a light source according to the present invention.

DETAILED DESCRIPTION OF THE INVENTION

As noted above, one of the main problems with a LED-based light source is the low brightness associated with such sources. Refer now to FIG. 1, which is a cross-sectional view of a prior art LED-based light source 10. In general, prior art LED-based light sources consist of a number of LEDs on a planar light reflecting heat sink 14. Exemplary LEDs are shown at 11–13. Because of the large difference in the index of refraction between the material from which the LEDs are constructed and air, only light that strikes the top surface of the LED at an angle less than the critical angle escapes the LED. The remaining light is trapped within the LED which acts a light pipe. The trapped light is partially absorbed into the LED material. The portion of the trapped light that exits the LED along the sides as shown at 16 enters a neighboring LED where it continues to be absorbed and trapped. The light that finally reaches the edge of the LED array is typically traveling in a direction that is outside the acceptance angle of the optical system that collimates the light, and hence, even this light is effectively lost.

This problem is overcome in one embodiment of a light source according to the present invention by utilizing a non-planar reflecting heat sink. Refer now to FIG. 2, which is a cross-sectional view of one embodiment of a light source according to the present invention. Light source 20 is constructed from a plurality of LEDs of which LEDs 21–23 are exemplary. The LEDs are mounted on heat sink 24 that includes a plurality of planar facets 91 set at angles to the optical axis of the optical system that collimates the light from light source 20. The direction of the optical axis is shown by the arrow at 26. The angle of inclination 25 is set such that light leaving both the top surface and sides of the LED leaves at an angle within the acceptance cone of the optical system 29 that collimates the light. In addition, light that leaves the side of a LED toward a facet of the heat sink is reflected back by the heat sink surface at an angle that is within the acceptance angle of the optical system. Such a ray is shown at 27. In addition light that is emitted from one LED at an angle such that it hits another LED as shown at 90 is reflected from the surface of LED 21 thereby increasing the radiance of LED 21.

A second embodiment of the present invention in which light leaving the edges of the LEDs is reflected into the acceptance angle of the optical system is shown in FIG. 3, which is a cross-sectional view of a light source 30 according to the present invention. Light source 30 includes a plurality of LEDs mounted on a planar reflecting heat sink 34. Exemplary LEDs are shown at 31–33. The spaces 35 between the LEDs are filled with a transparent medium 55 that includes scattering particles as shown at 36. The scattering particles reflect the light traveling parallel to the surface of the heat sink. A significant fraction of the scattered light is reflected either directly into the acceptance aperture of the optical system or off the heat sink and then into the acceptance aperture of the optical system. Light that escapes the scattering particles and passes through a neighboring LED is subjected to further scattering when the light leaves the neighboring LED.

A third embodiment of the present invention in which light leaving the edges of the LEDs is reflected into the acceptance angle of the optical system is shown in FIG. 4, which is a cross-sectional view of a light source 40 according to the present invention. Light source 40 differs from light source 30 discussed above in that the area between the LEDs contains reflectors 46 that reflect the light leaving the sides of the LEDs into the acceptance aperture of the optical system. The dimensions of the LEDs are of the order of 0.5 mm; hence, the reflectors can be fabricated using a wide range of fabrication techniques. For example, the reflectors can be formed from stamped metal parts that are coated with a reflective material.

Various modifications to the present invention will become apparent to those skilled in the art from the foregoing description and accompanying drawings. Accordingly, the present invention is to be limited solely by the scope of the following claims.

What is claimed is:

1. A light source for generating light that is collected by an optical system, said optical system accepting light leaving said light source within a predetermined acceptance angle relative to an axis defined in relation to said optical system, said light source comprising:

a plurality of LEDs mounted on a reflective base, each of said LEDs generating light that leaves that LED via a top surface, a bottom surface, and one or more side surfaces of said LED, said reflective base having a reflective surface in contact with said bottom surface of each of said LEDs, and a plurality of reflectors for reflecting light leaving said side surfaces of said LEDs into said acceptance angle of said optical system, at least one of said reflectors being located between two of said LEDs.

2. The light source of claim 1 wherein said reflectors comprise a plurality of facets for reflecting light leaving said side surfaces of said LEDs at an angle such that said light leaves said light source at an angle within said acceptance angle.

3. A light source for generating light that is collected by an optical system, said optical system accepting light leaving said light source within a predetermined acceptance angle relative to an axis defined in relation to said optical system, said light source comprising:

a plurality of LEDs mounted on a reflective base, each of said LEDs generating light that leaves that LED via a top surface, a bottom surface, and one or more side surfaces of said LED, said reflective base having a reflective surface in contact with said bottom surface of each of said LEDs, and a plurality of reflectors for reflecting light leaving said side surfaces of said LEDs into said acceptance angle of said optical system, wherein said reflectors comprise a plurality of facets for reflecting light leaving said side surfaces of said LEDs at an angle such that said light leaves said light source at an angle within said acceptance angle, and wherein said LEDs are mounted such that said bottom surface of each LED is in contact with one of said facets, that facet reflecting light generated in that LED and light leaving one of said side surfaces of an adjacent LED.

4. A light source for generating light that is collected by an optical system, said optical system accepting light leaving said light source within a predetermined acceptance angle relative to an axis defined in relation to said optical system, said light source comprising:

a plurality of LEDs mounted on a reflective base, each of said LEDs generating light that leaves that LED via a top surface, a bottom surface, and one or more side surfaces of said LED, said reflective base having a reflective surface in contact with said bottom surface of each of said LEDs, and a plurality of reflectors for reflecting light leaving said side surfaces of said LEDs into said acceptance angle of said optical system, wherein said reflectors comprise a plurality of scattering particles dispersed in a transparent medium between said LEDs, said scattering particles being located such that light leaving the top of said LEDs is not scattered.

* * * * *